United States Patent [19]

Eaton, Jr. et al.

[11] 4,198,694
[45] Apr. 15, 1980

[54] X-Y ADDRESSABLE MEMORY

[75] Inventors: James R. Eaton, Jr., Palo Alto; Charles G. Sodini, San Francisco; Laurence G. Walker, Palo Alto, all of Calif.

[73] Assignee: Hewlett-Packard Company, Palo Alto, Calif.

[21] Appl. No.: 890,172

[22] Filed: Mar. 27, 1978

[51] Int. Cl.² .................. G11C 11/24; G11C 11/40
[52] U.S. Cl. ................................. 365/149; 365/183
[58] Field of Search ............... 365/149, 183, 184, 185

[56] References Cited
U.S. PATENT DOCUMENTS 3,728,695  4/1973  Bentchkowsky ............... 365/185
3,851,317  11/1974  Kenyon ............................. 365/184
4,086,662  4/1978  Itoh .................................... 365/149
4,094,008  6/1978  Lockwood et al. ............... 365/149

Primary Examiner—Stuart N. Hecker
Attorney, Agent, or Firm—Ronald E. Grubman

[57] ABSTRACT

Each memory cell of an x-y addressable semiconductor memory includes a charge storage element serially connected with an I-O (bit) line through a pair of CCD-type transfer gates. One gate is responsive to x-addressing and the other gate to y-addressing.

When an x-y address is selected only the charge storage element of the one selected memory cell communicates with the bit line.

10 Claims, 4 Drawing Figures

4,198,694

X-Y ADDRESSABLE MEMORY

BACKGROUND OF THE INVENTION

This invention is concerned generally with digital information storage devices, and particularly with random access memories (RAM's) in which logic "1" or "0" bits are represented by charge stored in an array of individual memory cells. In prior art RAM's, each cell typically includes an MOS capacitor as a storage element and a transistor to gate the storage capacitor to an input-output (I-O) line, commonly referred to as a "bit-line". The memory cells are configured in an x-y (two-dimensional) array in which the storage capacitors of the elements in any column are all connected in parallel to the same bit-line, while the gates of all transistors of the memory elements of any row are connected in parallel to a "word-line". To access any particular memory element in the x-y array, the word-line corresponding to the desired row is brought high, permitting charge from the storage capacitors of each element in that row to pass through the gating transistor of that element and be shared with the associated bit-line. The resulting voltage swing of each bit-line is detected by a sense amplifier associated with that bit-line. A reading of the particular sense amplifier corresponding to the desired column gives an indication of the logic state of the selected memory cell.

The operation described above is a "destructive read" in that the charge stored in all of the memory cells of the selected row has now been lost. Thus, the data in the sense amplifiers must be rewritten back into these memory cells to restore each memory element to its original state. This "rewrite" operation, as well as the memory "write" operation itself is accomplished as follows: the sense amplifier for each column drives the associated bit-line to a "high" or "low" state which concomitantly charges the storage capacitor of the cells whose word lines are high.

In RAM's of the type discussed above the use of one sense amplifier for each bit-line is required to "read" the state of the memory cells, to restore the memory elements to their original state after the "read" operation and to "write" into the memory cells generally. However, the use of large numbers of sense amplifiers results in excessive power dissipation requirements for the semiconductor chip on which the memory is fabricated. This problem has become more severe as technology has made possible the fabrication of larger RAM's on smaller chips.

SUMMARY OF THE INVENTION

In accordance with the illustrated preferred embodiments, the present invention provides a RAM with x-y addressing capabilities within each separate memory cell. This enables a "read" or "write" operation to be performed on any selected memory cell using only a single sense amplifier associated with one bit-line in communication with the selected memory cell. Power dissipation requirements for the semiconductor chip are thereby greatly reduced.

In preferred embodiments, each memory cell of the x-y addressable RAM of the invention utilizes an MOS storage capacitor serially connected with a corresponding bit-line through two MOS gates in series, this arrangement being essentially equivalent to a two-stage charge coupled device (CCD) shift register. One gate is activated by a row-line corresponding to the traditional word-line, while the second gate is activated by a column-line. The storage capacitor of any given memory cell therefore communicates with the bit-line only when both gates within the cell are activated. This condition occurs only when both the row and column lines corresponding to the selected cell are activated to permit a "read" or "write" operation on the selected memory cell. Thus, e.g. when any given memory cell of a row is "read", only the one storage capacitor corresponding to that cell is connected with its corresponding bit-line. The storage capacitors of all other cells do not communicate with the bit-lines, and so remain undisturbed. Since it is not necessary to rewrite data into any of these other cells, only one sense amplifier need be utilized. Power dissipation on the chip is thereby significantly reduced.

DETAILED DESCRIPTION OF THE INVENTION

Figure 1:
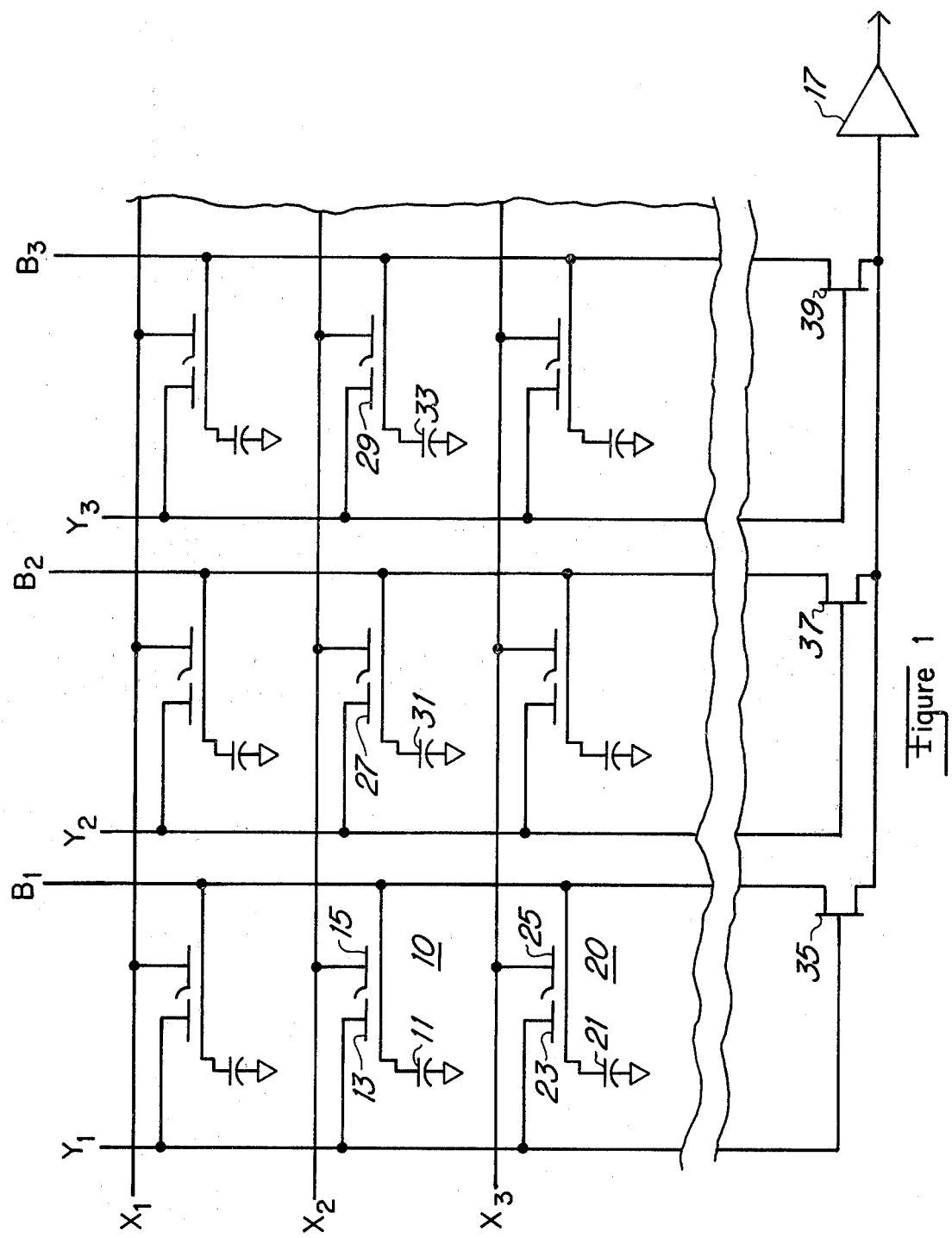
FIG. 1 shows a portion of a RAM in which memory cells according to the invention are accessed by activation by row and column lines.

In FIG. 1 there is shown a portion of a RAM in which individual memory cells are accessed by activation of selected row and column lines. A particular memory cell according to the invention is exemplified by the cell labeled 10 which is addressed by a column-line labeled $y_1$ and a row-line labeled $x_2$. Memory cell 10 includes a storage capacitor 11 which communicates with a bit-line $B_1$ through a semiconductor structure which is essentially a two-gate reversible CCD shift register whose structure will be discussed in more detail in connection with FIG. 3. In FIG. 1, the two transfer gates of the CCD shift register of memory cell 10 are labeled 13 and 15.

Operation of the memory cell can most easily be understood in terms of the operation of a CCD shift register. Suppose, for example, it is desired to read the state of memory cell 10, which state is characterized by a certain amount of charge stored on capacitor 11. For example, a logic "1" may be represented by a relatively high level of stored charge while a logic "0" may be represented by a relatively low level of stored charge. To read the state of memory cell 10 an array decoder (not shown, but well known in the art, such as a standard "NOR" gate binary decoder) is activated to bring both row-line $x_2$ and column-line $y_1$ to a "high" voltage level. When column-line $y_1$ is taken high a "high" voltage level is applied to gate 13. This creates a potential well beneath gate 13 so that charge which was stored on capacitor 11 will move to a region beneath gate 13. Similarly, when $x_2$ is taken high, gate 15 will be also taken high creating a potential well under gate 15. The charge in the region below gate 13 will be transferred into the region below gate 15, to be shared with bit-line $B_1$. The resulting change in voltage on bit-line $B_1$ is sensed by a sense amplifier 17, e.g. of the type discussed in an article by Boonsta et al. in IEEE Journal So. St. Circ., SC-8,305(1973).

Consider now another memory cell 20 in the RAM. The structure of cell 20 corresponds to that of cell 10, including a capacitive storage element 21, a first CCD gate 23 and a second CCD gate 25. When row-line $x_2$ and column-line $y_1$ are activated as described above to access memory cell 10, gate 23 of cell 20 will also be taken high thereby transferring the charge stored on capacitor 21 to a region under gate 23. However, since row-line $x_3$ has not been activated, gate 25 will not be taken high so that no potential well will be formed in the region beneath gate 25. Thus, the charge which was stored on gate 21 will be trapped beneath gate 23 and will not be accessible to bit-line $B_1$. Furthermore, when gate 23 is returned to a "low" state (at the conclusion of the read operation to access cell 10) all of the charge beneath gate 23 will be returned to storage gate 21. In like manner the operation of cell 20, no charge from any other memory element corresponding to column $y_1$ will be transferred to bit-line $B_1$. Sense amplifier 17 will therefore not sense any charge from elements in column $y_1$ other than from memory cell 10. Similar reasoning obtains to demonstrate that charge from memory elements interconnected with row-line $x_2$ (other than cell 10) will also not be transferred to any bit line. For example, the CCD gates 27 and 29 interconnected with co-lumn-lines $y_2$ and $y_3$ respectivelywill not be taken high since column-lines $y_2$ and $y_3$ have not been activated. Charge stored on capacitors 31 and 33 will therefore not find any conductive path available to bit-lines $B_2$ or $B_3$. In summary, when row-line $x_2$ and column-line $y_1$ are taken high, sense amplifier 17 will be responsive only to the charge stored in memory cell 10.

To rewrite data into cell 10 after the destructive read operation described above, the process is reversed; i.e. row-line $x_2$ and column-line $y_1$ are taken high to provide access between bit-line $B_1$ and capacitor 11. Sense amplifier 17 applies a "high" or "low" voltage level to bit-line $B_1$ to charge capacitor 11, which is subsequently isolated by deactivation of the row and column lines. This same procedure is also utilized to write new data into cell 10. Thus, in a RAM according to the invention only a single sense amplifier is required to read from or write into all of the memory cells of the x-y array.

In some preferred embodiments of the invention, transistor gates such as 35, 37 and 39 in FIG. 1 are included to isolate each bit-line from each other bit-line. Each transistor gate is activated by the particular co-lumn- line corresponding to the bit-line being switched through that transistor. For example, column-line $y_1$ activates gate 35 to connect bit-line $B_1$ to sense amplifier 17. Thus, it is assured that the charge shared with any bit-line will be appropriately sensed by sense amplifier 17, while isolation among the various bit lines is pro-vided to minimize stray capacitance and therefore pro-vide a larger signal to be sensed.

Figure 2:
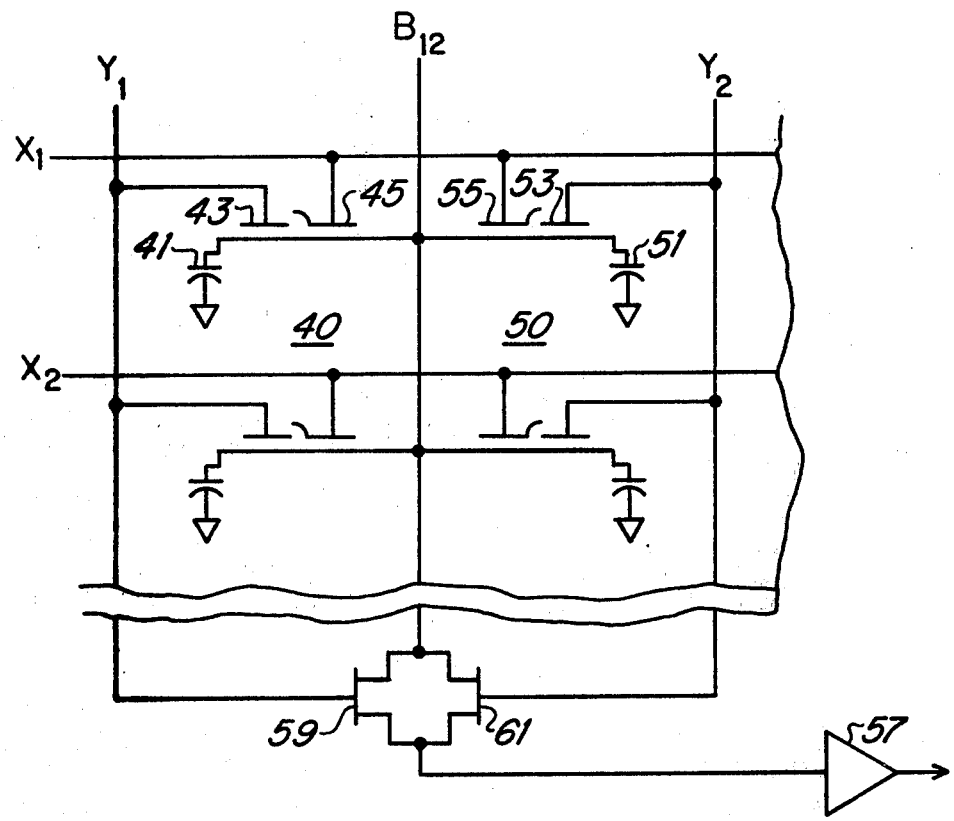
FIG. 2 shows portions of a RAM in accordance with aspects of the invention in which one bit-line is shared between two memory cells.

In a RAM according to the invention, it is possible to further reduce the size of the semiconductor chip re-quired for the memory by sharing bit-lines among mem-ory cells of different columns of the memory array. For example, in FIG. 2 a bit-line labeled $B_{12}$ is shared be-tween two memory cells 40 and 50 which are respon-sive to column-lines $y_1$ and $y_2$ respectively. Thus, a capacitor storage element 41 of cell 40 is connected through a gate 43 and a gate 45 to bit-line $B_{12}$. In a similar manner a capacitor 51 of memory cell 50 is gated through two gates 53 and 55 to the same bit-line $B_{12}$.

Thus, if row-line $x_1$ and column line $y_1$ are both taken high, the charge representing the state of memory cell 40 will be shared with bit-line $B_{12}$ and detected by a sense amplifier labeled 57. On the other hand, if row-line $x_1$ and column-line $y_2$ are activated, sense amplifier 57 will detect charge representing the state of memory element 50. As in FIG. 1 gating transistors 59 and 61 may be employed to isolate bit-line $B_{12}$ from all of the other bit-lines on the chip. It will be understood by those skilled in the art that the principle exemplified in FIG. 2 can be extended to other configurations in which more than two rows of memory elements share a common bit-line, thereby effectuating an even further reduction of chip area.

Figure 3:
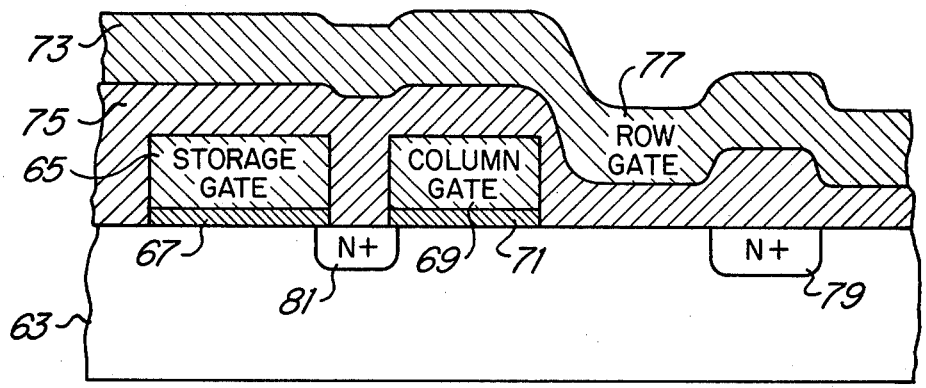
FIG. 3 illustrates the construction of a memory cell according to a preferred embodiment of the invention.

A preferred embodiment of a memory cell according to the invention is shown in FIG. 3. A semiconductor substrate 63, e.g. of P-type doped silicon underlies the structure. A storage gate 65 which is preferably a polysilicon layer about 6000 Å thick, overlays an oxide layer 67 on substrate 63. Oxide layer 67 is preferably a layer of silicon dioxide about 1000 Å thick. This gate-oxide-substrate region forms the capacitive storage ele-ment of the memory cell which corresponds e.g. to element 11 of cell 10 in FIG. 1. It is also possible to enhance the storage capacity of the element by utilizing an enhanced capacitor structure such as is disclosed in U.S. patent application Ser. No. 838,199 filed Sept. 30, 1977, assigned to the present assignee. A conductive transfer gate 69 overlays a thin oxide layer 71 on sub-strate 63. Gate 69 is responsive to a column-line of the memory array and will therefore be designated as a "column-gate". This gate is also preferably of polysili-con and may be fabricated during the same processing step as storage gate 65. In terms of memory cell 10 shown in FIG. 1 column-gate 69 corresponds to gate 13 activated by row-column-line $y_1$. A second conductive level 73 also preferably of polysilicon is separated from the first level by an oxide layer 75, about 1500 Å thick. A portion of conductor level 73 adjacent column-gate 69 is utilized as a "row" gate 77 responsive to a row-line of the array. Gate 77 corresponds to gate 15 of memory element 10 in FIG. 1, and is activated by row-line $x_2$. In FIG. 3, row-gate 77 is electrically accessed through the associated polysilicon level 73 (in the plane of the fig-ure), while gates 65 and 69 are accessed through associ-ated polysilicon lines in a direction perpendicular to the plane of the figure. A highly conductive N+ region 79 in substrate 63 serves as bit-line $B_1$ of FIG. 1. In FIG. 3 another highly conductive N+ region 81 is interposed between storage-gate 65 and column-gate 69 to allow charge stored under storage-gate 65 to be transferred to the region under gate 69 when a potential well is cre-ated in that region.

In operation, charge which is stored beneath storage-gate 65 will pass through conductive region 81 into the region beneath column-gate 69 when activation of the associated column-line causes an appropriate voltage to be applied to gate 69. For the materials and dimensions illustrated in FIG. 3 a voltage of 12 V applied to gate 69 will produce a suitable potential well in substrate 63. When the row-line associated wih gate 77 is activated, a voltage of about 12 V is applied to gate 77 creating a potential well under that gate. Charge beneath gate 69 will flow into the region beneath gate 77 and thereafter into bit-line 79. The resulting change in voltage of the bit-line will be sensed as described in connection with FIG. 1 to provide an indication of the logic state of the memory cell.

Figure 4:
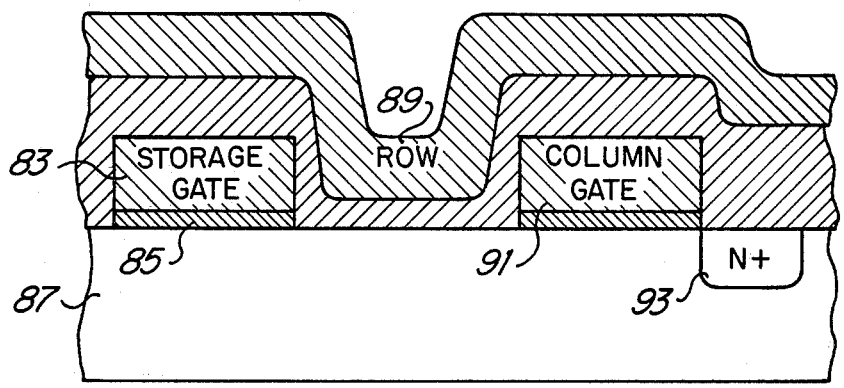
FIG. 4 illustrates another embodiment of the invention.

In FIG. 4 there is illustrated an alternate embodiment in which the capacitive element is formed by a storage gate 83 on an oxide layer 85 on a semiconductor substrate 87. In this embodiment a second level polysilicon row-gate 89 is positioned adjacent storage gate 83, while a first level polysilicon column-gate 91 is positioned between row-gate 89 and a bit-line 93. By virtue of the overlap of the first and second polysilicon levels in this embodiment, row-gate 89 may be physically positioned directly adjacent storage-gate 83, so that no conductive region is required in substrate 87 to transfer charge from the capacitive element to the region beneath gate 89. It will also be evident to those skilled in the art that in all of the illustrated embodiments the row and column gates may be interchanged so that the row-gates would be associated with the first polysilicon level and the column-gates would be associated with the second polysilicon level.

We claim:

1. A semiconductor memory comprising:
   an x-y array of memory cells on the substrate;
   a plurality of row-lines, each row-line accessing in parallel the memory cells of a row of memory cells;
   a plurality of column-lines, each column-line accessing in parallel the memory cells of a column of memory cells;
   a plurality of bit-lines, each bit-line accessing in parallel the memory cells of at least one column of memory cells;
   detection means for detecting a change in voltage appearing on the associated bit-line when charge from the memory cell is shared with the associated bit-line; and
   each of the memory cells including therein;
   (a) storage means for storing charge representing a digital logic state; and
   (b) gating means responsive to activation of the associated row-line and column-line respectively to permit charge stored in the storage means to be shared with the associated bit-line when the row-line and column-line corresponding to said memory cell are activated.

2. A semiconductor memory as in claim 1, said memory being fabricated on a semiconductor substrate and, wherein:
   the gating means comprises an adjacent pair of electrically conductive transfer gates operating in response to activation of the associated row-line and column-line respectively to create potential wells in the substrate beneath the gates, whereby charge will be transferred from the storage means to the associated bit-line.

3. A semiconductor memory as in claim 2 wherein:
   the storage means comprises an MOS capacitor on the substrate.

4. A semiconductor memory as in claim 3 wherein:
   the MOS storage capacitor includes a conductive storage gate which is a portion of a first conductor level on the substrate;
   a first one of the transfer gates is adjacent the storage gate and constitutes another portion of the first conductor level on the substrate; and
   a highly conductive region in the substrate to conduct charge from the storage capacitor to a region beneath the first transfer gate; and
   one of the transfer gates is adjacent the first transfer gate and constitutes a portion of a second conductor level.

5. A semiconductor memory as in claim 3 wherein:
   the MOS storage capacitor includes a conductive storage gate which is a portion of a first conductor level on the substrate;
   a first one of the transfer gates is adjacent the storage gate and constitutes a portion of a second conductor level; and
   a second one of the transfer gates is adjacent the first transfer gate and constitutes a portion of the first conductor level.

6. A semi-conductor memory as in claim 3 wherein:
   the detection means comprises a single sense amplifier interconnected with all of the bit-lines.

7. A semiconductor memory as in claim 6 further comprising:
   switching means for electrically isolating each bit-line from each other bit-line and for selectively providing access from each bit-line to the sense amplifier.

8. A semiconductor memory as in claim 1 wherein:
   each of the bit-lines accesses in parallel the memory cells of more than one column of memory cells.

9. A semiconductor memory as in claim 8 wherein:
   the detection means comprises one sense amplifier interconnected with each bit-line.

10. A semiconductor memory as in claim 8 wherein;
    the detection means comprises a single sense amplifier interconnected with all of the bit-lines.

* * * * *